United States Patent
Sofin et al.

(10) Patent No.: US 7,939,173 B2
(45) Date of Patent: May 10, 2011

(54) POLYCRYSTALLINE SILICON ROD FOR ZONE REFLECTING AND A PROCESS FOR THE PRODUCTION THEREOF

(75) Inventors: Mikhail Sofin, Bughausen (DE); Hans-Christof Freiheit, Burghausen (DE); Heinz Kraus, Zeilarn (DE)

(73) Assignee: Wacker Chemie AG, Munich (DE)

( * ) Notice: Subject to any disclaimer, the term of this patent is extended or adjusted under 35 U.S.C. 154(b) by 443 days.

(21) Appl. No.: 12/119,558

(22) Filed: May 13, 2008

(65) Prior Publication Data

US 2008/0286550 A1    Nov. 20, 2008

(30) Foreign Application Priority Data

May 16, 2007    (DE) .......................... 10 2007 023 041

(51) Int. Cl.
*B32B 9/04*     (2006.01)
*B32B 13/04*    (2006.01)
*C23C 16/00*    (2006.01)
*C23C 16/01*    (2006.01)
*C01B 33/02*    (2006.01)

(52) U.S. Cl. .......... 428/446; 264/81; 423/348; 423/349; 423/350; 427/248.1; 428/448

(58) Field of Classification Search .................. 423/348, 423/349, 350; 264/81; 427/248.1; 428/446, 428/448

See application file for complete search history.

(56) References Cited

U.S. PATENT DOCUMENTS

| | | | |
|---|---|---|---|
| 3,540,871 A | 11/1970 | Dyer et al. | |
| 4,255,463 A | 3/1981 | Rucha et al. | |
| 4,426,408 A * | 1/1984 | Dietze ........................... | 423/348 |
| 5,310,531 A | 5/1994 | Ikeda et al. | |
| 5,976,481 A | 11/1999 | Kubota et al. | |
| 6,060,021 A | 5/2000 | Oda | |
| 6,676,916 B2 * | 1/2004 | Keck et al. ..................... | 423/348 |
| 2003/0015078 A1 | 1/2003 | Taylor | |
| 2006/0249200 A1 * | 11/2006 | Kato et al. ..................... | 136/258 |
| 2008/0053232 A1 | 3/2008 | Hegen et al. | |

FOREIGN PATENT DOCUMENTS

| | | |
|---|---|---|
| CN | 1194624 C | 9/1998 |
| DE | 27 27 305 | 1/1979 |
| DE | 3107260 A1 | 9/1982 |
| DE | 10 2006 040 486 A1 | 3/2008 |
| EP | 0 445 036 B1 | 7/1998 |

OTHER PUBLICATIONS

Machine English Translation of DE 2727305 provided by the EPO website, Retrieval date of Sep. 22, 2010.*
English Abstract corresponding to DE 27 27 305, published Jan. 4, 1979.
Schumann et al., Metallografie (Meetallography), Wiley-VCH, 2005, 14th Edition, 5 pgs.

* cited by examiner

*Primary Examiner* — Jennifer C McNeil
*Assistant Examiner* — Jonathan C Langman
(74) *Attorney, Agent, or Firm* — Brooks Kushman P.C.

(57) ABSTRACT

The invention relates to a polysilicon rod for FZ applications obtainable by deposition of high-purity silicon from a silicon-containing reaction gas, which has been thermally decomposed or reduced by hydrogen, on a filament rod. The polysilicon rod contains, surrounding the filament rod, an inner zone having but few needle crystals, small in size, an outer zone having a relatively small amount of larger needle crystals, and a smooth transition zone between the inner and outer zones. The polysilicon rods are obtained in high yield and can be refined in one pass in an FZ process.

15 Claims, 2 Drawing Sheets

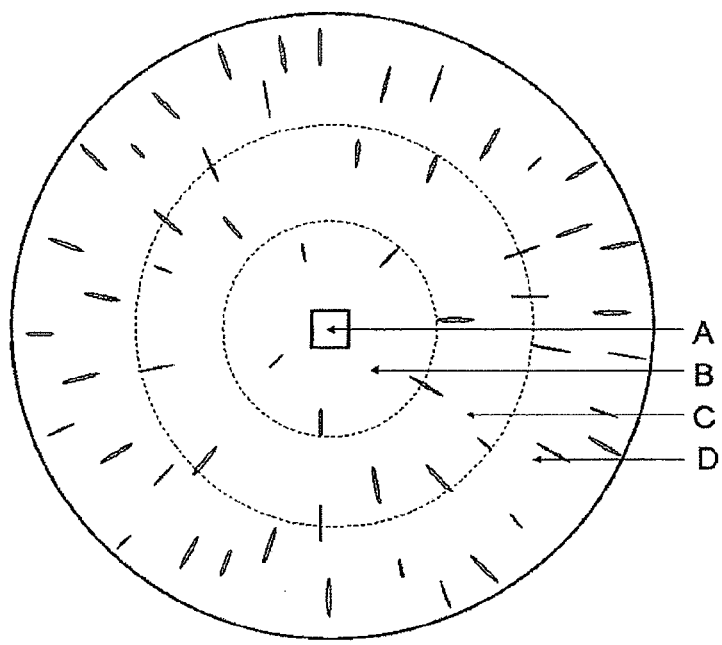
Fig. 1
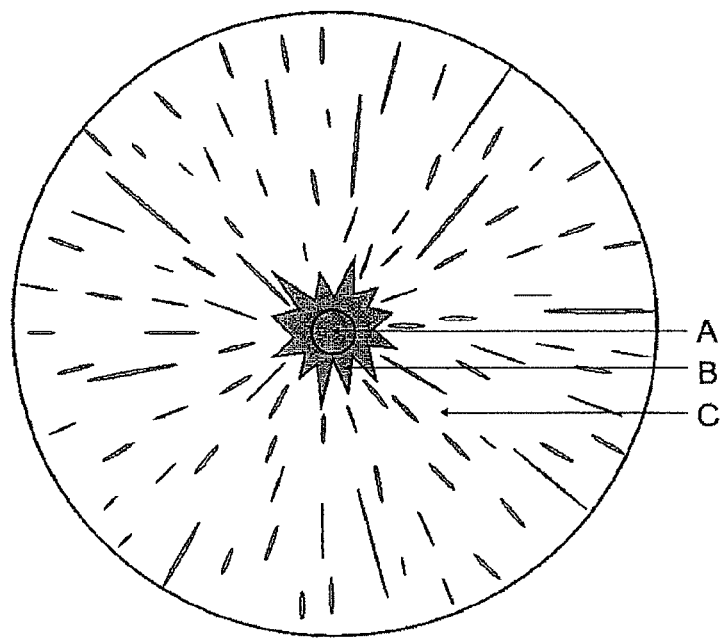
(PRIOR ART) Fig. 2

POLYCRYSTALLINE SILICON ROD FOR ZONE REFLECTING AND A PROCESS FOR THE PRODUCTION THEREOF

BACKGROUND OF THE INVENTION

1. Field of the Invention

The invention relates to a rod composed of polycrystalline silicon for further use in the production of a monocrystalline rod by means of a floating zone process (FZ process), and a process for the production thereof.

2. Background Art

High-purity polycrystalline silicon (polysilicon) serves as a starting material for the production of monocrystalline silicon for semiconductors according to the Czochralski process (CZ) or the floating zone process (FZ) and for the production of solar cells for photovoltaics.

Polycrystalline silicon rods are generally produced according to the Siemens process. In this case, a silicon-containing reaction gas is thermally decomposed or reduced by hydrogen and deposited as high-purity silicon on thin filament rods made of silicon, so-called thin rods or cores. Halosilanes, such as trichlorosilane, for example, are predominantly used as the silicon-containing component of the reaction gas.

The process is carried out in a deposition reactor with exclusion of oxygen. In general, two adjacent thin rods therein are connected at their free ends by a bridge to form a U-shaped carrier body. The U-shaped carrier bodies are heated to the deposition temperature by directly passing current through, and the reaction gas (a mixture of hydrogen and a silicon-containing component) is fed in.

For the production of the polycrystalline Si rods which are suitable for the production of monocrystalline Si rods by means of the FZ process, use is made of monocrystalline (usually of arbitrary crystal orientation) thin rods (filament rods). These rods are pulled in monocrystalline fashion from polycrystalline precursor rods in a separate step. The monocrystalline thin rods usually have a round (diameter 5 to 10 mm) or square (edge length 5 to 10 mm) cross section. During the deposition of silicon, the halogen-containing silicon compounds decompose and deposit as silicon on the surface of the heated thin rods. The diameter of the rods increases as deposition proceeds.

After a desired diameter has been reached, the deposition is ended and the resultant rod pairs are cooled down to room temperature. The shaped body is usually formed in U-shaped fashion, with two polycrystalline rods as legs and a bridge made of polycrystalline Si that links the legs. The legs are intergrown at their ends with the electrodes for power supply and are separated from the latter after the reaction has ended.

Since the feet and the bridges of the U-shaped bodies cannot be used for FZ refining, the yield of the finished polycrystalline rods is significantly less than 100%. The maximum length of the deposited polycrystalline Si rod is limited by the length of the thin rod used. The length of the finished polycrystalline Si rod relative to the length of the thin rod used is referred to as "length yield," or simply, "yield". The length of the finished polycrystalline rod is usually not more than 85% of the length of the thin rod used.

During the production of polycrystalline Si rods having a thick diameter it is often observed that the rods have cracks or break in the course of removal from the reactor or in the course of mechanical processing to form finished rods. The cracks and fractures arise in rods on account of thermal stresses caused by the temperature differences between the rod interior and the surface of the rod. The temperature differences and thus also the stresses are greater, the larger the diameter of the rod. The thermal stresses become particularly critical if the rod diameter is greater than 120 mm.

The rods afflicted with cracks or high thermal strains cannot be used for mechanical processing to form the finished polycrystalline rods and for subsequent production of the monocrystalline rods by means of the FZ process. The cracked or strained rods usually break as early as in the course of mechanical processing. If the rods withstand this treatment, they can result in serious consequences during zone refining. Since the rods are heated up to the melting point in this process, the cracked or thermally strained rods can shatter on account of additional thermal stresses. This leads to material and time losses as a result of the termination of the refining process. Furthermore, the refining apparatus can also be damaged by the rod pieces that have splintered off. Therefore, cracked and thermally strained polycrystalline silicon rods have to be sorted out prior to refining or be shortened to the defect site. Cracks in the polycrystalline Si rods can be detected visually or by means of a known method, such as e.g. sound testing or ultrasonic technology. This material exclusion once again reduces the yield. Processes conducted according to the prior art enable an average yield of the finished crack-free polycrystalline Si rods for the FZ process relative to the length of the thin rods used of not more than 50% if the rod diameter is greater than 120 mm.

The defect-free yield of the refined monocrystalline FZ silicon depends on the microstructure of the polycrystalline silicon rod used. The production of the polycrystalline silicon rods in Siemens reactors involves firstly depositing silicon on the monocrystalline thin rods in monocrystalline form. After some time, depending on the deposition conditions, the regime changes to the polycrystalline form. In this case, silicon is deposited both in the form of a finely crystalline matrix and as coarse-grained, usually acicular, monocrystalline (but often also as twins or triplets) inclusions (needle crystals) which are incorporated into the finely crystalline matrix. The needle crystals are predominantly oriented radially, wherein their longitudinal axis can exhibit <111>, <100>, or <110> orientations. The inhomogeneous microstructure has the effect that the individual crystallites, according to their size, do not melt simultaneously in the course of passing through the floating-zone melting zone. The crystallites that are unmelted owing to their size can slip through the melting zone as solid particles in the monocrystalline rod and be incorporated as unmelted particles at the solidification front of the single crystal. A defect formation is then caused at this location.

U.S. Pat. No. 5,976,481 describes avoiding cracking by means of a thermal aftertreatment of the polycrystalline Si rods in the reactor. However, the process can only avoid the formation of those cracks which arise only after the end of the deposition during the cooling down of the rods. However, cracks can already form during the deposition in the rods.

EP 0445036 describes the production of the central region of the polycrystalline Si rod under conditions such that silicon deposits there only in monocrystalline or coarsely crystalline fashion. However, this process requires monocrystalline thin rods of square cross section in a special orientation where the longitudinal axis points in the <100> direction, the production of which is very complicated and expensive. Moreover, this process requires a high temperature and low deposition rate. The lower deposition rate means that this deposition process has lower economic viability. The high deposition temperature causes high thermal stresses and thus leads to cracked rods.

U.S. Pat. No. 3,540,871, U.S. Pat. No. 4,255,463 and DE-2727305 describe processes for enabling monocrystalline deposition to be suppressed by various factors, such that from the outset only polycrystalline silicon grows. However, the methods described cannot prevent the formation of disturbing coarse monocrystalline inclusions. Moreover, the processes proposed lead to high thermal stresses in the case of thick polycrystalline silicon rods having a diameter of greater than 120 mm, such that the crack-free yield of the finished rods after mechanical processing is very low, usually lower than 40%. DE2727305 proposes how the growth of the coarsely crystalline grains can be suppressed during deposition. For this purpose, for approximately one hour the temperature (proceeding from 1100° C.) is reduced by 200° C. and the gas flow is reduced by 25% and the molar fraction of the halosilane is increased from 7-15% to 50%. This step is repeated a number of times (up to three times). This procedure additionally stresses the Si rods as a result of the constantly altered thermal stresses and leads to the visible deposition rings in the microstructure. These rings in the polycrystalline Si rods disturb the FZ refining process and cause defects in the monocrystalline FZ rod.

All of the known methods from the prior art yield either very thin polycrystalline rods or thicker rods having stresses which, upon cooling down or during further processing, lead to defects through to the total unusability of the rod.

SUMMARY OF THE INVENTION

An object of the invention is to provide polycrystalline silicon rods with high yield during the production of thick polycrystalline silicon rods having a diameter of greater than 120 mm for FZ applications, and to counteract the frequent formation of defects during the refining of the polycrystalline silicon rods to form FZ single crystals having a large diameter. A further aim of the invention is to reduce the production costs of polycrystalline rods by using more cost-effective polycrystalline filament rods in contrast to the monocrystalline filament rods described in the prior art which are produced in a complicated manner and are therefore expensive.

BRIEF DESCRIPTION OF THE DRAWINGS

FIG. 1 shows a schematic view of the cross section of the polycrystalline Si rod in accordance with one embodiment of this invention.

FIG. 2 shows as comparison a schematic view of the cross section of the polycrystalline Si rod in accordance with the prior art.

DETAILED DESCRIPTION OF THE PREFERRED EMBODIMENT(S)

Figure 3:
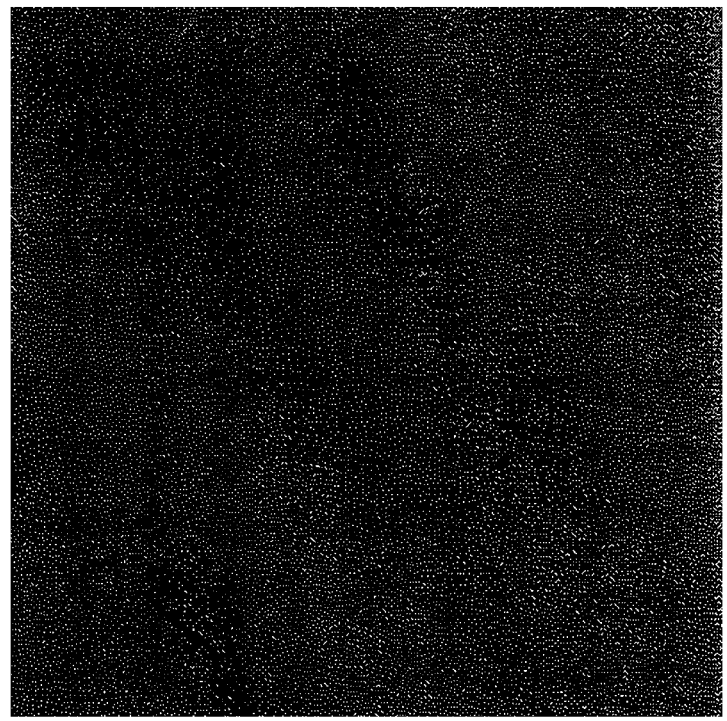
FIG. 3 shows a micrograph (gain of 5) of the inner region of the polycrystalline Si rod according to the present invention.

The invention thus relates to a polysilicon rod obtainable by deposition of high-purity silicon from a silicon-containing reaction gas, which has been thermally decomposed or reduced by hydrogen, onto a filament rod, wherein the polysilicon rod has at least four different regions having different microstructures in the radial cross section of the rod, wherein a) a polycrystalline thin rod is present in the innermost region A, the center of the polycrystalline rod, b) a region B of deposited polycrystalline silicon, which is characterized by no or only very few needle crystals, is present around the thin rod, c) an outer region D of the polycrystalline silicon rod wherein the proportion by area of needle crystals is less than 7%, wherein the length of the needle crystals is less than 15 mm and the width of the needle crystals is less than 2 mm and wherein in this outer region of the polycrystalline Si rod the length of the microcrystals of the matrix does not exceed 0.2 mm, and d) a mixed zone C, between the regions B and D, in which the crystal microstructure undergoes transition fluidly from the microstructure in region B to the microstructure in region D.

The invention furthermore relates to the use of a polycrystalline thin rod as a filament rod for the production of polycrystalline thick rods for FZ applications.

The polycrystalline thin rods used in the invention are sawn cost-effectively from a polycrystalline thick rod. The thin rods can have an arbitrary cross-sectional form; the rods with a square cross section are preferred since such thin rods can be produced the most simply.

The form of the thin rod is not of importance for the present invention. The thin rods having a square cross section having the edge length of 5 to 10 mm are preferably used. Since the thin rod has only a small proportion of the volume of the polycrystalline Si rod, its microstructure is not of great importance. Preferably, the microstructure of the thin rod fulfils the requirements made of the outer zone D, preferably of the inner zone B.

The diameter of the region B (FIG. 1, B) lying around the thin rod is at least as large as the melting zone during the FZ process used later, preferably greater than 30 mm, more preferably greater than 80 mm.

The proportion by area of the needle crystals in the region B is less than 1%, wherein the needle crystals are not longer than 5 mm and not wider than 1 mm. On account of the small size of the few needle crystals, the latter are completely melted during the later FZ process and the possibility of the needle crystals or their residues migrating through the melting zone in unmelted fashion and causing a defect in the later monocrystalline rod is thus precluded.

In the outer region D of the polycrystalline Si rod (FIG. 1, D), the proportion by area of the needle crystals is less than 7%, preferably less than 5%, wherein the length of the needle crystals is less than 15 mm, preferably less than 7 mm, and the width of the needle crystals is less than 2 mm, preferably less than 1.5 mm. The outer zone D begins at the latest at a rod diameter of 120 mm, preferably starting from 100 mm. The highest thermal stresses in the polycrystalline silicon rod form in the outer region during the deposition process. The finely crystalline matrix increases the strength in such a way that no fractures and cracks occur in the rod region outside the rod foot at the electrodes and in the region of the bridge.

The mixed zone C (FIG. 1, C) that arises between the inner region B (FIG. 1, B) and outer region D (FIG. 1, D) contains a crystal microstructure that undergoes transition fluidly from the microstructure in region B to the microstructure in region D. This mixed zone lies within the diameter range of 30 mm to 120 mm, preferably within the diameter range of 50 mm to 100 mm.

The rod cross section according to the invention contains no deposition rings. Deposition rings are rapid microstructure changes which arise during rapid changes in the growth conditions such as, for example, abrupt changes in the deposition temperature or sudden changes in the feed quantities for the deposition. Deposition rings are not usually formed if the temperature is changed by less than 15° C. or more slowly than 10° C./h or other deposition parameters (reaction gas throughput, concentration of the silicon-containing component, depositing rate) are changed by less than 30% or more slowly than 20%/h.

The proportion of needle crystals and their size of the crystallites can be determined by means of customary metallographic methods. A slice is cut from the rod perpendicular to the axial direction of the rod and is ground and polished at least on one side. For better contrast, the polished surface of the Si slice is to be etched. The etchants and etching duration that are customary for Si can be found e.g. in Metallografie [Metallography] by H. Schumann and H. Oettel (Wiley-VCH, Weinheim, 2005). After the action of etchant, the microcrystallites of the microstructure become readily visible under a light microscope and can easily be measured. In this case, the needle crystals (coarse monocrystalline inclusions) appear brighter than the matrix. The size of the needle crystals of bright appearance and also their proportion by area can be determined from electronic recordings in a computer-aided manner. As is customary in metallography, the length of a needle crystal is assumed to be its maximum Feret diameter, and the width is assumed to be its minimum Feret diameter.

FIG. 1 shows a schematic view of the cross section of the polycrystalline Si rod in accordance with one embodiment of this invention. Situated in the center of the rod is the polycrystalline thin rod (A) surrounded by the inner zone (B). Adjacent to this is the mixed zone (C) adjoining the outer zone (D).

For better differentiation, the different regions have been schematically delimited by the dashed imaginary rings. The needle crystals are schematically represented as gray acicular regions.

FIG. 2 shows as comparison a schematic view of the cross section of the polycrystalline Si rod in accordance with the prior art. Lying in the center is the monocrystalline thin rod (A) surrounded by silicon (B) deposited in monocrystalline fashion and silicon (C) deposited in polycrystalline fashion. The needle crystals are schematically represented as gray acicular regions.

FIG. 3 shows a micrograph (gain of 5) of the inner region of the polycrystalline Si rod according to the present invention. A part of the polycrystalline thin rod (zone A) is visible in wedge-shaped fashion in the middle of the left-hand edge of the image. The rest of the image shows the inner zone B surrounding the thin rod, in which zone no needle crystals are visible. The microstructure contains no deposition rings.

Figure 4:
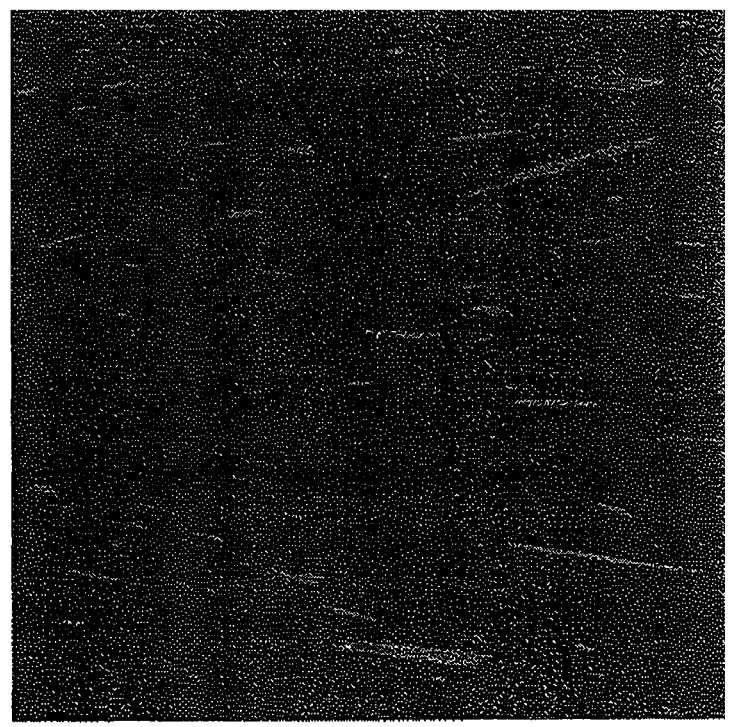
FIG. 4 shows a micrograph (gain of 5) of the outer region (zone D) of the polycrystalline Si rod according to the present invention.

FIG. 4 shows a micrograph (gain of 5) of the outer region (zone D) of the polycrystalline Si rod according to the present invention. Needle crystals are clearly visible here as bright needles. The microstructure contains no deposition rings.

During the later zone refining process (FZ process), the molten silicon flows from the outer region (region D) into the melting zone. Silicon is intermixed in the course of flowing, such that the needle crystals melt completely and do not adversely influence the crystallization process on the monocrystalline rod. Furthermore, enough time remains for the needle crystals to melt since they have the largest distance from the outer rod region of the polycrystalline silicon rod to the coil neck. The polysilicon rods according to the invention can be refined in monocrystalline fashion and without any defects in a single pass through the floating-zone melting zone during the FZ process.

The invention furthermore relates to a process for the production of a polycrystalline silicon rod, comprising the following steps:

a) use of a carrier body in the form of a filament rod composed of silicon,
b) setting the rod temperature to 950 to 1090° C. at the beginning of the deposition,
c) deposition of silicon from Si-containing gas diluted with hydrogen and having a molar fraction of the chlorosilane compounds of at most 30%, wherein the gas flow is selected such that the Si depositing rate is 0.2 to 0.6 mm/h,
d) maintaining these conditions until the rod reaches the diameter of at least 30 mm, such that an inner region is formed,
e) at the latest after a rod diameter of 120 mm has been reached, changing the rod temperature to 930 to 1030° C. and reducing the amount of hydrogen introduced by nozzles such that the molar fraction of the chlorosilanes in the feed gas is increased to at least 35%, but at most 60%, and the gas flow is selected in this case such that the Si depositing rate is 0.2 to 0.6 mm/h, wherein an outer region is formed,
f) fluidly changing process conditions during the production of the inner region to the process conditions for the outer region, wherein the gas flow is in this case selected such that the Si depositing rate is 0.2 to 0.6 mm/h, and
g) not abruptly changing the growth conditions during the entire deposition time.

The polycrystalline silicon rods according to the invention can be produced with the diameter of at least 120 mm, preferably at least 130 mm, and most preferably from 150 to 250 mm, and with an average yield of more than 70% (relative to the length of the thin rods used).

Thin rods made of polycrystalline silicon are used as carrying bodies for the deposition of the polycrystalline silicon.

At the beginning of the deposition, the rod temperature is set to 950 to 1090° C., preferably 1000 to 1075° C., more preferably 1010 to 1050° C. The Si-containing gas diluted with hydrogen is introduced into the reactor by means of nozzles. The molar fraction of the chlorosilane compounds, preferably trichlorosilane, is then at most 30%, preferably 20 to 25%. The Si-containing gas decomposes on the hot rod surface, silicon being deposited. In this case, the gas flow is selected such that the Si depositing rate is 0.2 to 0.6 mm/h, preferably 0.25 to 0.4 mm/h. These conditions are maintained until the rod reaches the diameter of the melting zone during the FZ process, usually at least 30 to 50 mm, preferably at least 80 to 100 mm, such that the inner region is formed. These conditions ensure that no or only very few and small needle crystals are formed in this region.

At the latest when the rod reaches a diameter of 120 mm, the rod temperature is changed to 930 to 1030° C., preferably 950 to 1020° C., more preferably to higher than 960° C. and lower than 990° C., and the amount of hydrogen introduced by means of nozzles is reduced such that the molar fraction of the chlorosilanes in the feed gas is increased to at least 35% but at most 60%. The gas flow is selected such that the Si deposition rate is 0.2 to 0.6 mm/h, preferably 0.25 to 0.4 mm/h. In this case, the outer region forms with a finely crystalline matrix, wherein the proportion by area of needle crystals does not exceed 7% and they are not longer than 15 mm and not wider than 2 mm. These conditions are maintained until the rod reaches the target diameter. The deposition rate, reduced by the temperature reduction, is compensated by the higher molar proportion of chlorosilanes, such that a more than proportional increase in the gas flow does not become necessary. The freedom from cracks in the rods and thus the yield of more than 70%, relative to the length of the thin rods, are achieved by virtue of the fact that the rods are exposed to lower thermal stresses.

The lower stresses are produced at this point by the process conditions because the rods have a lower temperature, the gas mixture with the lower proportion of hydrogen has a lower thermal conductivity such that the rods are thermally insulated better, and the rods are exposed to a lower gas flow. Moreover, the rods according to the invention have the finely crystalline matrix in the outer region, which is better at withstanding thermal stresses.

Preferably, the process conditions are changed over fluidly from those in the inner region B to those in the outer region D. In this case, the gas flow is to be selected such that the Si depositing rate is 0.2 to 0.6 mm/h, preferably 0.25 to 0.4 mm/h. The way in which the deposition conditions are to be changed can be calculated from the time required for the deposition of the zone C and the difference between the parameters at the end of the zone B and at the start of the zone D. The time can be determined from the thickness of the zone C and the deposition rate selected.

The invention will be demonstrated in greater detail in the examples that follow.

Comparative Example 1

The polycrystalline silicon described in this example was deposited in accordance with the prior art. The round monocrystalline filament rods (diameter 8 mm) were exposed to the mixture of trichlorosilane (TCS) and hydrogen (molar fraction of TCS 20%). The rod temperature was set to 1100° C. during the entire deposition time. The gas flow was regulated such that the Si depositing rate was 0.4 mm/h. After the diameter of 150 mm had been reached, the deposition was ended, rods were cooled down, removed from the reactor and processed for the zone refining. The processed rods were checked for freedom from cracks by means of ultrasonic technology, as described in DE102006040486. If the rod was afflicted with cracks, the defective region was cut off. If the residual piece that remained was not shorter than 50 cm, it was forwarded for FZ refining. The average crack-free yield was in this case only 30%, relative to the length of the thin rods used. The rods were then refined by means of the FZ process to form the monocrystalline rods. Only 10% of the processed crack-free polycrystalline Si rods could be refined to form the monocrystalline defect-free rods by means of one floating zone pass.

Comparative Example 2

In this example, the procedure for producing the polycrystalline Si rods was carried out in the same way as described in example 1, with the difference that the molar fraction of TCS was 50%, the rod temperature was regulated to 1000° C. and the gas flow was selected such that the deposition rate was 0.25 mm/h. The freedom from cracks was checked, as described in example 1. The average crack-free yield was 75% in this case. 30% of the polycrystalline rods used could be refined in monocrystalline fashion without any defects during one pass through the floating zone.

Comparative Example 3

In this example, the procedure for producing the polycrystalline Si rods was carried out analogously to example 1, with the difference that the molar fraction of TCS was 25%, the rod temperature was regulated to 1050° C. and the gas flow was selected such that the deposition rate was 0.35 mm/h. The freedom from cracks was checked, as described in example 1. The average crack-free yield was 45% in this case. All of the polycrystalline rods could be refined in monocrystalline fashion without any defects during one pass through the floating zone.

Example 4

The polycrystalline silicon rods described in this example were deposited according to the present invention. Trichlorosilane was used as silicon-containing component of the reaction gas. The polycrystalline Si thin rods (square cross section, edge length 8 mm) were used as carrier bodies. Firstly, the deposition was carried out at 1050° C. with a gas mixture having a TCS fraction of 20%. The deposition rate was 0.35 mm/h in this step, as also throughout the deposition time. After the rods had reached the diameter of 60 mm, the rod temperature was slowly lowered to 990° C. and at the same time the TCS fraction was increased to 40%. The change took place slowly ("fluidly"), such that it was completed only when the rod reached the diameter of 102 mm (after 60 hours). The deposition was then continued under these conditions until the rods reached the diameter of 150 mm. After removal from the reactor, the rods, having an average crack-free yield of 75% could be processed for the zone refining. The inspection for cracks took place as in example 1. By means of the FZ process, 100% of the polycrystalline rods used could be refined in monocrystalline fashion without any defects in one pass through the floating zone.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A polycrystalline silicon rod having a diameter, obtained by deposition of high-purity silicon from a silicon-containing reaction gas which has been thermally decomposed or reduced by hydrogen onto a filament rod, wherein the polycrystalline silicon rod has at least four different regions having different microstructures in a radial cross section of the rod, these regions comprising:
    a) a polycrystalline filament rod as an innermost region A, at the center of the polycrystalline silicon rod,
    b) a region B of deposited polycrystalline silicon containing no or only very few needle crystals around the innermost region A, the region B having a diameter,
    c) an outer region D having a polycrystalline microcrystal-containing matrix, and having a proportion by area of needle crystals of less than 7%, wherein the length of the needle crystals is less than 15 mm and the width of the needle crystals is less than 2 mm and in this outer region D the length of the microcrystals of the matrix does not exceed 0.2 mm, and
    d) between the regions B and D, a mixed region C, in which the crystal microstructure undergoes transition fluidly from the microstructure in region B to the microstructure in region D.

2. A polycrystalline silicon rod of claim 1 which is suitable for preparation of a monocrystalline silicon by a floating zone process in one amass.

3. The polycrystalline silicon rod of claim 2, wherein the diameter of the polycrystalline silicon rod is greater than 120 mm.

4. The polycrystalline silicon rod of claim 1, wherein the diameter of the polycrystalline silicon rod is greater than 120 mm.

5. The polycrystalline silicon rod of claim 1, wherein the filament rod has a square cross section having an edge length of 5 to 10 mm.

6. The polycrystalline silicon rod of claim 1, wherein the microstructure of the filament rod corresponds to the microstructure of regions B or D.

7. The polycrystalline silicon rod of claim 1, wherein the diameter of the region B lying around the filament rod is at least as large as the melting zone of floating zone FZ method that is to be used to form a monocrystalline silicon rod.

8. The polycrystalline silicon rod of claim 7, wherein the diameter of the region B lying around the filament rod is greater than 30 mm.

9. The polycrystalline silicon rod of claim 1, wherein the proportion by area of the needle crystals in the region B is less than 1%, and wherein the needle crystals are not longer than 5 mm and not wider than 1 mm.

10. The polycrystalline silicon rod of claim 1, wherein the outer region D begins at the latest at a diameter of 120 mm of the polycrystalline silicon rod.

11. The polycrystalline silicon rod of claim 1, wherein the polycrystalline silicon rod cross section contains no deposition rings.

12. A process for the production of a polycrystalline silicon rod of claim 1 by deposition of Si, comprising the following steps:
   a) providing a carrier body in the form of a filament rod composed of polycrystalline silicon,
   b) heating the filament rod to a temperature of 950 to 1090° C.,
   c) depositing silicon from Si-containing feed gas diluted with hydrogen and having a molar fraction of chlorosilane compounds of at most 30%, wherein the gas flow is selected such that the Si deposition rate is 0.2 to 0.6 mm/h,
   d) maintaining these conditions until the rod reaches a diameter of at least 30 mm, such that an inner region B is formed,
   e) at the latest after a rod diameter of 120 mm has been reached, changing the rod temperature to from 930 to 1030° C. and reducing the amount of hydrogen such that the molar fraction of chlorosilanes in the feed gas is increased to at least 35%, but at most 60%, and the gas flow is selected such that the Si deposition rate is 0.2 to 0.6 mm/h, wherein an outer region D is formed,
   f) fluidly changing the process conditions during the production of the inner region B to the process conditions for the outer region D, wherein the gas flow is selected such that the Si deposition rate is 0.2 to 0.6 mm/h, and
   g) not abruptly changing the growth conditions during the entire deposition of Si.

13. The process of claim 12, wherein the filament rod consists of polycrystalline silicon.

14. The process of claim 12, wherein the average yield of polycrystalline silicon rods is greater than 70% relative to the length of the filament rod used.

15. The process of claim 14, wherein substantially all the yield of polysilicon rods are refinable by one pass through an floating zone process.

* * * * *

UNITED STATES PATENT AND TRADEMARK OFFICE
CERTIFICATE OF CORRECTION

| | | |
|---|---|---|
| PATENT NO. | : 7,939,173 B2 | |
| APPLICATION NO. | : 12/119558 | |
| DATED | : May 10, 2011 | |
| INVENTOR(S) | : Mikhail Sofin et al. | |

It is certified that error appears in the above-identified patent and that said Letters Patent is hereby corrected as shown below:

Column 10, Line 30, Claim 15:

After "pass through" delete "an" and insert -- a --.

Signed and Sealed this
Twenty-third Day of August, 2011

David J. Kappos
*Director of the United States Patent and Trademark Office*